US006389304B1

(12) United States Patent
Van Den Brink et al.

(10) Patent No.: US 6,389,304 B1
(45) Date of Patent: May 14, 2002

(54) METHOD OF AND DEVICE FOR IMAGING AN OBJECT BY MEANS OF MAGNETIC RESONANCE

(75) Inventors: Johan S. Van Den Brink; Paulus J. M. Folkers, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/206,437

(22) Filed: Dec. 7, 1998

(30) Foreign Application Priority Data

Dec. 8, 1997 (EP) .............................. 97203845

(51) Int. Cl.[7] .............................................. A61B 5/055
(52) U.S. Cl. ..................... 600/419; 600/420; 324/306; 324/307; 324/309
(58) Field of Search ................................ 600/410, 419, 600/420; 324/307, 309, 306

(56) References Cited

U.S. PATENT DOCUMENTS 5,494,655 A * 2/1996 Rocklage et al. ............ 600/419
5,713,359 A * 2/1998 Dumoulin et al. ........... 600/419
5,833,610 A * 11/1998 Yokawa et al. .............. 600/419

OTHER PUBLICATIONS

"A k–Space Analysis of Small–Tip–Angle Excitation", by J. Pauly et al. as published in Journal of Magnetic Resonance 1989, No. 81, pp. 43–56.

"High Resolution Measurement of Cerebral Blood Flow Using Intravascular Tracer Bolus Passages. Part II: Experimental Comparison Results" as published by L. Ostergard et al. in Magnetic Resonance in Medicine No. 36, 1996, pp. 726–736.

"A Functional MRO Technique Combining Principles of Echo–Shifting with a Train of Observations (PRESTO)" as published by g. Liu et al in "Magnetic Resonance in Medicine", No. 30, 1993, pp. 764–768.

"Perfusion Measurements with Bolus Tracking" as published by A. Mclaughlin in Mini–categorial Course, Conference International Society for Magnetic Resonance in Medicine, Apr. 12–189, 1997, Vancouver, Canada.

* cited by examiner

Primary Examiner—Ruth S. Smith
(74) Attorney, Agent, or Firm—John F. Vodopia

(57) ABSTRACT

The invention relates to a method of imaging perfusion parameters of, for example blood in a volume of the brain in the head of a body by means of magnetic resonance, in which a contrast medium is introduced into a blood flow within the body, said contrast medium flowing, via the carotid arteries, to the volume in the head to be imaged by means of magnetic resonance. The images of the volume which are reconstructed from the magnetic resonance signals received are subsequently deconvoluted with an arterial input function of the contrast medium in a supply to the volume imaged. This arterial input function is determined according to the invention by excitation of spins and measurement of a magnetic resonance signal in an elongate part of the body which contains the carotid arteries and has a cross-section which is at least equal to a diameter of a carotid artery.

11 Claims, 3 Drawing Sheets

METHOD OF AND DEVICE FOR IMAGING AN OBJECT BY MEANS OF MAGNETIC RESONANCE

BACKGROUND OF THE INVENTION

1. Field of the Invention

The invention relates to a method of imaging perfusion parameters of a liquid in a first part of a body by means of magnetic resonance, which method includes the following steps: measuring MR signals of spins in the first part by generating MR imaging pulse sequences, reconstructing MR images from the measured MR signals, determining an image containing the perfusion parameters of the first part from a combination of the reconstructed MR images and an input function of a contrast medium which flows to the first part of the body via a supply for the liquid, and determining, using magnetic resonance, information for determining the input function of the contrast medium.

2. Description of Related Art

The invention also relates to an MR device for carrying out said method. In the context of the present patent application, a k-space is to be understood to mean a spatial frequency domain in which a path is followed during the measurement of the MR signals by application of gradients to the steady magnetic field. The path in the k-space is determined by the time integral of the gradients applied during the interval between the excitation of the spins and the instant in time at which the MR signal is measured. The measured values of the MR signals which correspond to the most important part of the path or paths yield the inverse Fourier transformed values of an image of the object. Furthermore, a gradient is to be understood to mean a temporary magnetic field which is superposed on a steady magnetic field and causes a gradient in the steady magnetic field.

The above method is known from the article "High Resolution Measurement of Cerebral Blood Flow Using Intravascular Tracer Bolus Passages. Part II: Experimental Comparison and Preliminary Results" as published by L. Ostergard et al. in Magnetic Resonance in Medicine No. 36, 1996, pp. 726–736. The known method is used to determine, for example perfusion parameters of the liquid in the first part of the body, for example a cerebral blood flow in a part of the brain. Perfusion parameters indicate an exchange between inter-cellular and extra cellular fluid. The perfusion parameters can be represented in an MR perfusion image which may be used as an aid to a physician to detect early stroke in the brain of the body to be examined. Furthermore, according to the known method MR signals are measured in the part of the brain by means of EPI pulse sequences in order to reconstruct a first series of MR images so as to trace the progression in time of the cerebral blood flow. In order to obtain a quantitative distribution of a cerebral blood flow in the part of the brain. The perfusion MR image is determined from the combination of the MR-image and the input function of the contrast medium. The input function represents a concentration of the contrast medium in the supply as a function of time. The MR image is deconvoluted with the input function of the contrast medium in a supply to the part of the brain. An example of such an input function comprises the arterial input function of the middle cerebral artery. In order to determine the arterial input function of the middle cerebral artery, the known method utilizes EPI MR imaging sequences to measure MR signals for a second series of MR images of a second part of the body which comprises a part of the blood supply to the part of the brain. After reconstruction of the second MR images, an operator determines a number of, for example from 5 to 10 arterial pixels in the second MR images, which arterial pixels represent a part of the middle cerebral artery. The arterial input function is determined on the basis of the variation in time of the intensity of the arterial pixels. In order to obtain, for example an image of a cerebral blood flow of voxels of the part of the brain, pixels in the series of MR images which correspond to the voxels are deconvoluted with the arterial input function obtained. It is a drawback of the known method that the determination of the arterial input function from the arterial pixels is not reproducible and that errors are liable to occur in the determination of the arterial input function.

SUMMARY OF THE INVENTION

It is an object of the invention to reduce errors in the determination of the arterial input function. To this end, the method according to the invention is characterized in that the input function is determined by application of a input pulse sequence for the excitation of spins in a second elongated part of the body and measuring input function MR-signal from the second part, the second elongated part of the body comprising a part of a vessel transporting the contrast medium to the first part, a cross section of the second elongated part being chosen such that a contribution from excited spins from the contrast medium in the vessel in the second elongated part dominates a contribution from other excited spins of the second elongated part to the MR-signal. For example, when the cross-section of the elongated second part equals twice the diameter of the vessel the contribution from the excited spins of the contrast medium in the part of the vessel dominates the contribution from the excited other spins from the part of the second elongated part. Because the input pulse sequence can be a very short sequence compared to the standard MR-imaging sequences a high temporal resolution of the input function can be obtained. Furthermore, the input function can be reproducibly determined from the MR-signal. In order to determine an input function the measured MR-signal is fourier transformed and the spin densities corresponding to the different positions in the second elongated part can be obtained from the fourier transformed MR-signals. The input function can be obtained, for example, by summing the spin densities for all the different positions.

A special version of the method according to the invention is characterized in that in order to measure the input function MR signals, the input pulse sequence includes a measuring gradient which is oriented along a longitudinal axis of the elongate second part. Thus, the input function MR signal is measured wherefrom a transverse magnetization of a position along the gradient can be determined by means of a 1D Fourier transformation. An advantage of the use of an input pulse sequence containing only a single measuring gradient resides in the fact that the input function MR signal can be quickly measured relative to a bolus passage of the contrast medium, so that the accuracy of the input function is enhanced. By fast measurement of the input function MR signal relative to the local measuring time of MR signals for reconstructing a single image of the series of MR images, disturbances in the magnetization in the first part during the measurement of the MR signals for the reconstruction of the series of images are minimized, so that the risk of artefacts in the images is reduced.

A further version of the method according to the invention is characterized in that for the determination of the input function from the measured input function MR signals a value of the input function associated with an instant at which an input function MR signal has been measured is determined from a combination of elements of a one-dimensional Fourier transformation of the input function MR signal. For example, summing the amplitudes of the one-dimensional Fourier transformation of the input function MR signal enables determination of a value which is related to a concentration of the contrast medium present in the part of the supply at the instant at which the input function MR signal has been measured.

A further version of the method according to the invention is characterized in that the input pulse sequence includes a 2D excitation RF pulse for excitation of the spins in the second elongate part. The 2D excitation RF pulse is known from the article "A k-space analysis of small tip angle excitation", by J. Pauly et al. as published in Journal of Magnetic Resonance 1989, No. 81, pp. 43–56. When use is made of a 2D excitation RF pulse, an elongate second part which comprises a cylinder can be excited in a short period of time, for example 6 ms, so that the measuring time of the input function MR signal is further reduced and the accuracy of the input function is enhanced.

A further version of the method according to the invention is characterized in that the MR imaging pulse sequences include an echo planar imaging (=EPI) imaging pulse sequence. The use of EPI imaging pulse sequences enables fast measurement of the MR signals required for determining the MR image. An example of such a known EPI imaging pulse sequence is a multislice EPI imaging pulse sequence or a 3D EPI imaging pulse sequence.

A further version of the method according to the invention is characterized in that in the EPI MR imaging pulse sequence an echo time $T_e$ between an excitation RF pulse and a corresponding MR signal is greater than a repetition time $T_r$ between two temporally successive excitation RF pulses. As a result of this step, the MR signals are obtained with a small range of $T_2^*$ weights, where $T_2^*$ represents an actual transverse magnetic time constant. Such an EPI imaging pulse sequence is known from the article "A Functional MRI Technique Combining Principles of Echo-Shifting with a Train of Observations (PRESTO)" as published by G. Liu et al. in "Magnetic Resonance in Medicine", No. 30, 1993, pp. 764–768. A further version of the method according to the invention is characterized in that the elongate second part is chosen to extend transversely of the direction of the supply. The accuracy of the input function can be further enhanced by choosing the elongate second part to extend transversely of the supply.

The invention also relates to an MR device.

BRIEF DESCRIPTION OF THE DRAWING

The above and other, more detailed aspects of the invention will be described in detail hereinafter, by way of example, with reference to the drawing. Therein.

DETAILED DESCRIPTION OF THE PREFERRED EMBODIMENT

Figure 1:
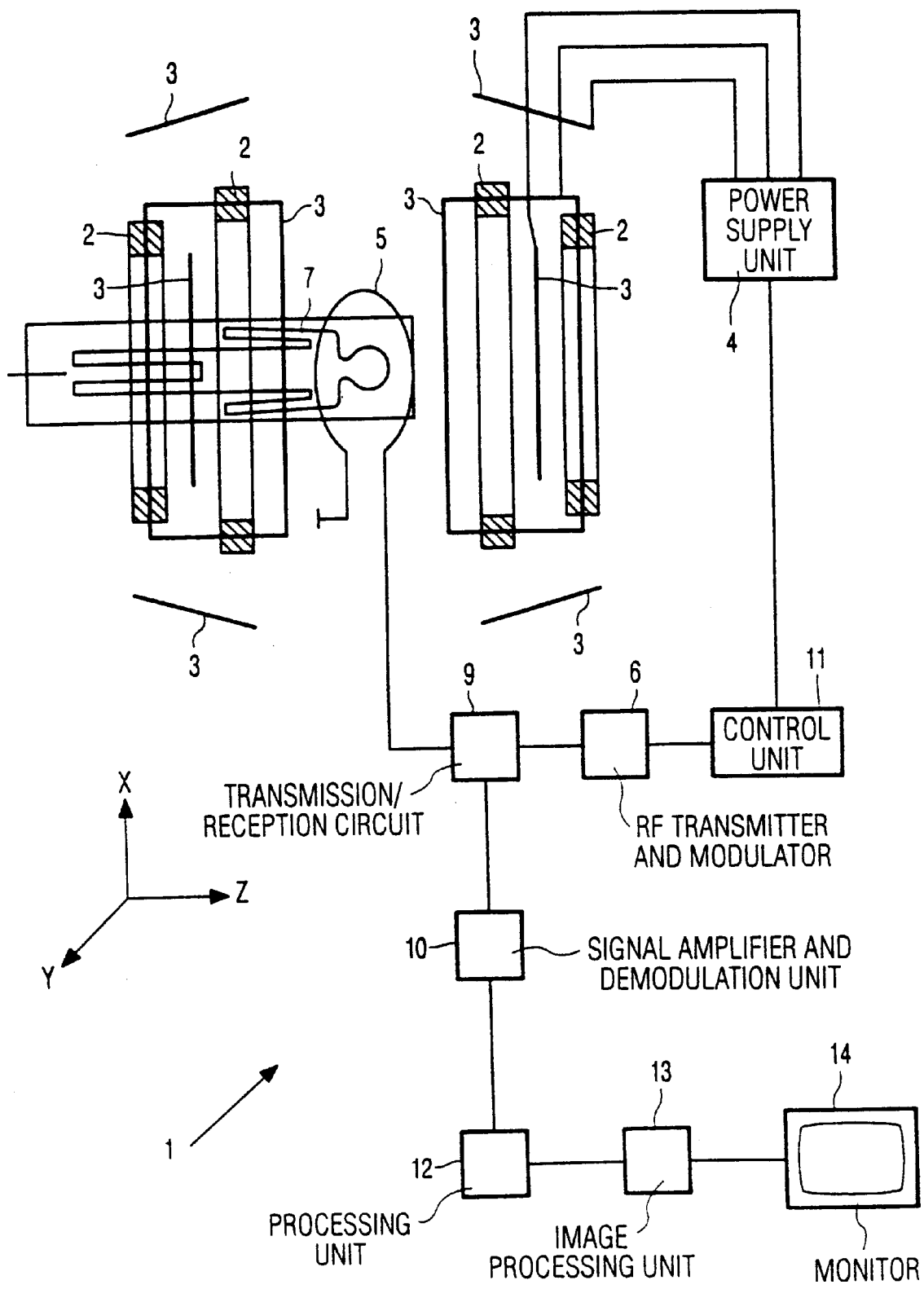
FIG. 1 shows a magnetic resonance imaging device.

FIG. 1 shows a magnetic resonance imaging device which includes a first magnet system 2 for generating a steady magnetic field, and also various gradient coils 3 for generating additional magnetic fields which are superposed on the steady magnetic field and cause a gradient in the steady magnetic field in three respective orthogonal directions of a co-ordinate system X, Y, Z. Generally speaking, a gradient in the first direction is referred to as a read-out gradient, a gradient in the second direction as a phase encoding gradient and a gradient in the third direction as a selection gradient. By convention the Z direction of the co-ordinate system shown corresponds to the direction of the steady magnetic field in the magnet system 2. The measuring co-ordinate system x, y, z may be chosen independently of the X, Y, Z co-ordinate system shown in FIG. 1. The gradient coils 3 are fed by the power supply unit 4. The MR device also includes an RF transmitter coil 5. The RF transmitter coil 5 serves to generate RF magnetic fields and is connected to an RF transmitter and modulator 6. A receiving coil is used to receive the magnetic resonance signal generated by the RF field in the object 7 to be examined in vivo, or in a part of the object to be examined, for example a human or animal body. The receiving coil may be the same coil as the RF transmitter coil 5. The magnet system 2 encloses an examination space which is large enough to accommodate a part of the body 7 to be examined. The RF transmitter coil 5 is arranged around or on a part of the body 7 within the examination space. The RF transmitter coil 5 is connected, via a transmission/reception circuit 9, to a signal amplifier and demodulation unit 10. The control unit 11 controls the RF transmitter and modulator 6 and the power supply unit 4 so as to generate special MR imaging pulse sequences which include RF pulses and gradients. The phase and amplitude derived from the demodulation unit 10 are applied to a processing unit 12. The processing unit 12 processes these signal values by means of, for example two-dimensional Fourier transformation so as to form an MR image. Using an image processing unit 13, the MR image is displayed on a monitor 14. The invention will be described on the basis of an echo-shifted EPI imaging pulse sequence. The echo-shifted EPI imaging pulse sequence is known from the cited article "A Functional MRI Technique Combining Principles of Echo-Shifting with a Train of Observations (PRESTO)". Apart from the echo-shifted EPI imaging pulse sequences described in the present application, other imaging pulse sequences may also be used. Examples in this respect are a 3D EPI imaging pulse sequence, a multislice EPI imaging pulse sequence, a Fast Field Echo imaging pulse sequence, a Turbo Spin Echo imaging pulse sequence, a Gradient and Spin Echo imaging pulse sequence, or helical imaging sequences. The afore-mentioned imaging pulse sequences are known inter alia from "Magnetic Resonance Imaging", by M. T. Vlaardingerbroek et al., Spinger-Verlag, 1995.

Figure 2:
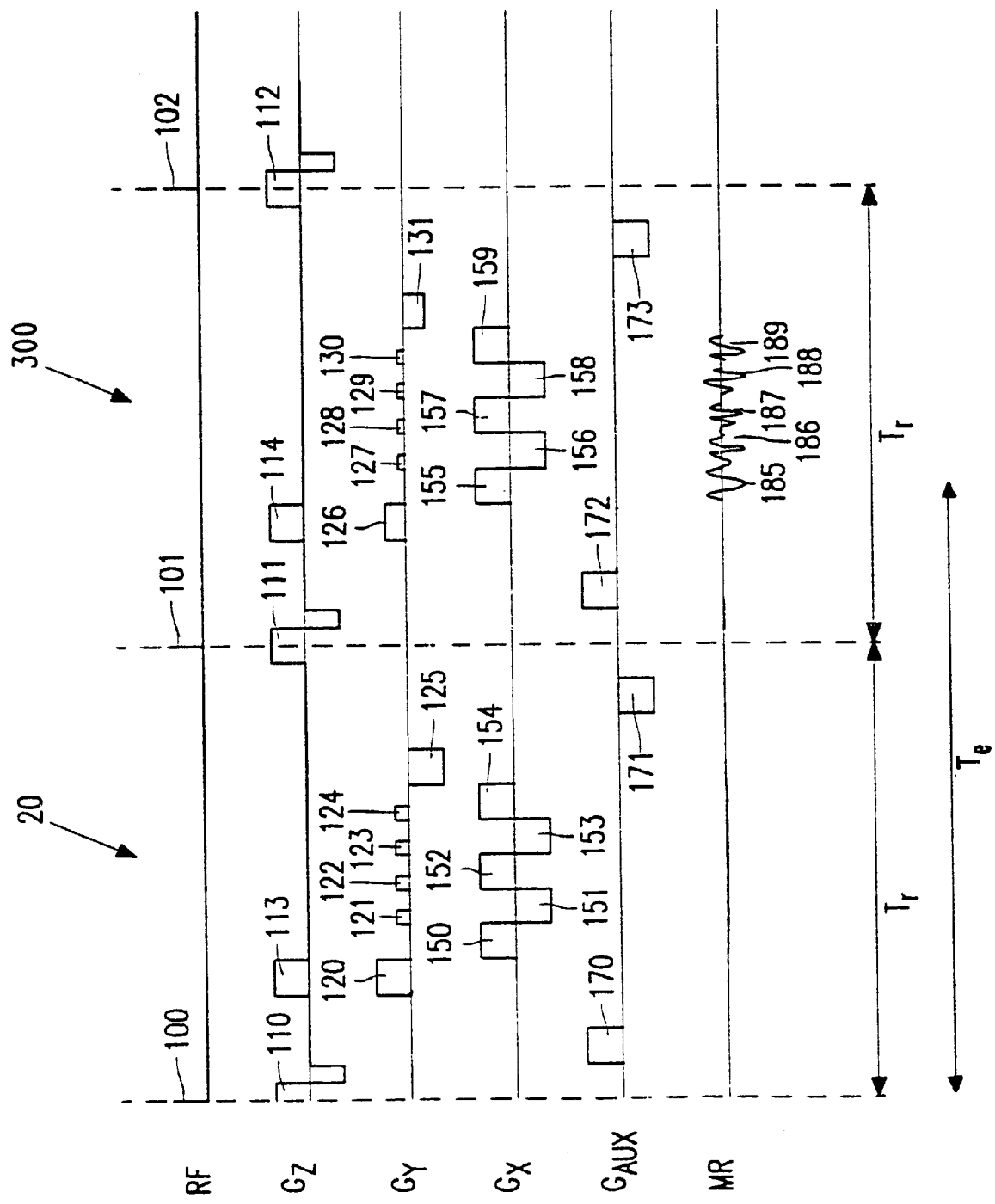
FIG. 2 shows a shifted echo EPI MR imaging pulse sequence.

FIG. 2 shows an example of an Echo-shifted EPI imaging pulse sequence as used in a version of the method according to the invention. FIG. 2 shows a first and a second echo-shifted EPI imaging pulse sequence 20, 300, each of which includes an excitation RF pulse, gradients $G_x$, $G_y$, $G_z$ and an auxiliary gradient. The control unit repeatedly generates the echo-shifted EPI imaging pulse sequences 20, 300 with a period $T_r$, for example 20 ms. The echo-shifted EPI imaging pulse sequences 20, 300 commence with the generating of an excitation RF pulse 100, 101 having a flip angle $\alpha$. The flip angle $\alpha$ of the excitation RF pulse 100, 101 amounts to, for example 10 degrees. The excitation RF pulse 100, 101 is rendered slice-selective by application of the selection gradients 110, 111 whereby the spins are excited in a volume of the body, for example a volume of the head which contains a part of the brain. After the slice selection, first auxiliary gradients 170, 172 are applied. The first auxiliary gradients 170, 172 are also referred to as "crusher" gradients. The first auxiliary gradient 170, 172 dephases an MR signal, to be generated by a gradient, with spins which have been excited in the same imaging pulse sequence 20, 300 as that in which the first auxiliary gradient 170, 172 has been generated. The second auxiliary gradient 171, 173 is applied after the read-out gradient 150–154, 155–159 at the end of the echo-shifted EPI imaging pulse sequence 20, 300, the direction of the second auxiliary gradient 171, 173 opposing that of the first auxiliary gradient 170, 172. Consequently, the spins excited by the excitation RF pulse 100 in the first echo-shifted EPI imaging pulse sequence 20 are rephased during the second echo-shifted EPI imaging pulse sequence succeeding the first echo-shifted EPI imaging pulse sequence. Furthermore, an echo time $T_e$ between an excitation RF pulse 100 and a corresponding MR signal 185 is longer than a repetition time $T_r$ between two temporally successive excitation RF pulses 100, 101. Preferably, the first auxiliary gradients 170, 172 are applied prior to an initial phase encoding gradient 120, 126 in the first and the second echo-shifted EPI imaging pulse sequence 20, 300, respectively. Furthermore, for example the first and second auxiliary gradients are applied by simultaneous application of the phase encoding gradient and the read-out gradient. the phase encoding gradient and the read-out gradient.

In order to measure the MR signals whose measuring points correspond to points situated on a first plurality of parallel lines which are regularly distributed in a second plurality of planes in a k-space and extend along the x axis, a z-phase encoding gradient 114, 115, an initial y-phase encoding gradient 120, 126 and read-out gradients 150–154, 155–159 are applied during the generating of the imaging pulse sequences. Furthermore, the phase encoding gradients 121–124, 127–150, referred to as "blips", are applied upon reversal of the direction of the read-out gradient $G_x$. The number of slices amounts to, for example 16 or 32. The number of parallel lines in a plane of the k-space amounts to, for example 64, 128 or 256. In order to measure a complete set of MR signals for reconstructing the volume of the part of the brain to be imaged, the echo-shifted EPI imaging pulse sequence 20 is repeated for a number of different values of the z-phase encoding gradient and the initial y-phase encoding gradient.

In order to reconstruct a perfusion image of the part of the brain, a contrast medium is introduced into the body via an artery. A generally known contrast medium contains, for example Gadolinium-diethylene tetramine pentaacetic acetate Gd-DPTA. After some time, the contrast medium arrives in a supply to the part of the brain and in the part of the brain. Examples of a supply to the part of the brain are the carotid arteries. In order to enable a concentration of the contrast medium to be tracked in time in the part in the brain, MR signals are measured during and after the administration, using EPI imaging pulse sequences, for example the MR signals required to reconstruct a single MR image of the volume being measured, for example during a first period of 2 seconds. The EPI imaging pulse sequences are repeated, for example during 80 seconds, in order to measure MR signals for the reconstruction of 40 MR images.

In order to make a quantitative analysis of the perfusion of the part of the brain, for example a cerebral blood flow (CBF) of the part of the brain, the processing unit 12 determines a response function of the volume of the voxels of the part of the brain by deconvolution of pixels, corresponding to a voxel, of the 40 temporally successive MR images with an input function of the carotid arteries, for example an arterial input function. This method is inter alia known from the article "Perfusion Measurements with Bolus Tracking" as published by A. Mclaughlin in Mini-categorial Course, Conference International Society for Magnetic Resonance in Medicine, April 12–18, 1997, Vancouver, Canada.

From the response functions determined the processing unit 12 can subsequently derive the CBF of the voxels if the ratio of the inverse actual transverse relaxation time and concentrations of the contrast medium of the volume in the part of the brain and a part of the carotid artery are known. An image processing unit 13 subsequently determines an image which represents the CBF of the voxels of the part of the brain. The image obtained can be displayed, for example by means of a monitor 14.

Figure 3:
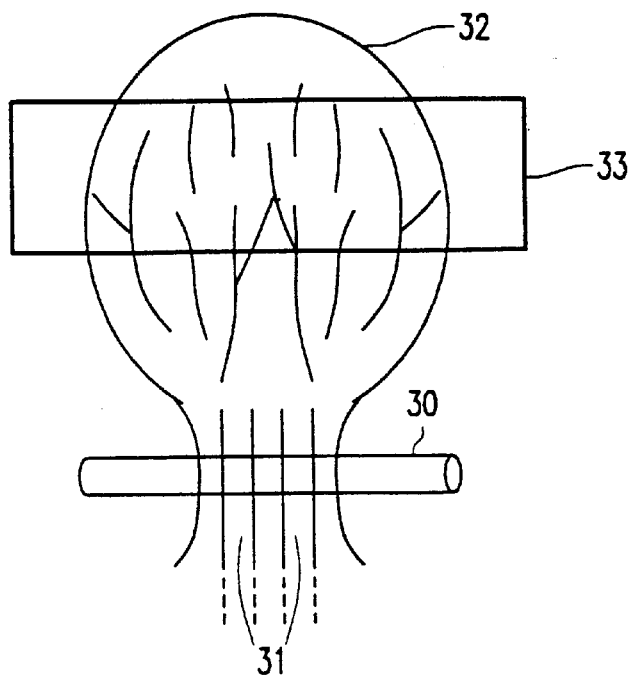
FIG. 3 shows the position of the cylindrical second part.
Figure 4:
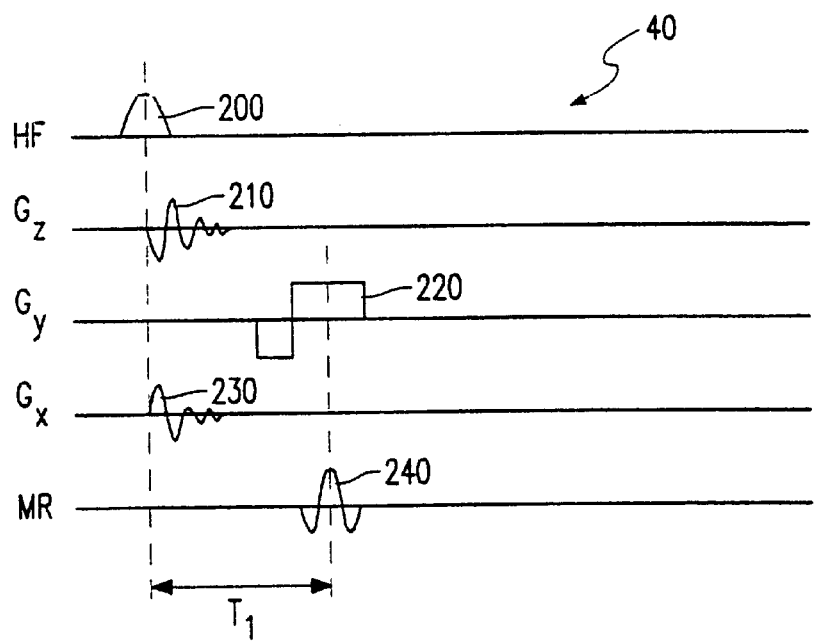
FIG. 4 shows a 2D excitation RF pulse for generating an input function MR signal.

In order to measure the arterial input function of the carotid arteries, in a version of the method according to the invention spins are excited in an elongate second part which includes a part of the supply and an input function MR signal is measured by means of an input pulse sequence. The elongate second part includes, for example a cylinder which contains a part of the carotid arteries of the body, the cylinder preferably being oriented transversely to the carotid arteries. FIG. 3 shows diagrammatically an example of the cylinder. FIG. 3 shows a first cross-section 32 of a head of a body and a second cross-section of a cylinder 30 which is oriented transversely of the carotid arteries 31 and does not intersect the part of the brain to be imaged. The cross-section of the cylinder 30 amounts to, for example 1 cm. The length of the cylinder is limited by the dimension of the MR device. FIG. 3 also shows a third cross-section 33 of the volume of the head to be imaged. FIG. 4 shows an example of the input pulse sequence.

FIG. 4 shows an example of the input pulse sequence 40. The input pulse sequence 40 includes a two-dimensional (2D) excitation RF pulse or a three-dimensional (3D) excitation RF pulse for the excitation of spins in the cylinder 30 which contains the part of the carotid arteries 31, a first and a second gradient, and a measuring gradient. The 2D excitation RF pulse 200 has a flip angle $\alpha_2$. A practical value for $\alpha_2$ is, for example 10°. The selective excitation of the cylinder 30 is realized by the first gradient 210 and the second gradient 230 which are directed perpendicularly to a supply direction, said supply direction being oriented, for example in the z direction. The duration of the 2D excitation pulse is, for example 6 ms. The directions of the first and the second gradient are oriented in the z direction and the x direction, respectively, in FIG. 4. Subsequently, after a period of time $\tau_1$ of, for example 10 ms, the input function MR signal 240 of the spins excited within the cylinder 30 is measured while applying at the same time the measuring gradient 220 which is oriented along a longitudinal axis of the cylinder 30. In order to mitigate the effect on the magnetization within the volume of the brain as caused by an interruption in the generating of the imaging pulse sequences by the generating of the input pulse sequence 30, the duration of the input pulse sequence is chosen to be as short as possible. A practical duration is, for example 10 ms or 15 ms.

Figure 5:
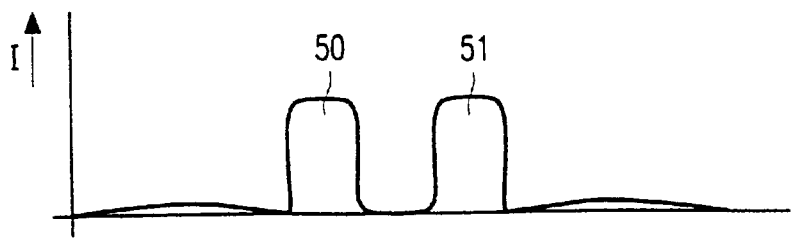
FIG. 5 shows an example of a 1D Fourier transformation of the input function MR signal.

In order to determine the arterial input function, a number of input function MR signals is measured by repeatedly generating the input pulse sequence 40 with a second period, the second period being chosen to be equal to the first period. Subsequently, the processing unit 12 determines the arterial input function from the input function MR signals 240 measured. To this end, a 1D Fourier transformation of a measured input function MR signal is determined. The amplitude of the 1D Fourier transformation determined for the input function MR signal corresponds to a transverse magnetization and the frequency of the 1D Fourier transformation determined for the input function MR signal corresponds to a position along the cylinder. FIG. 5 shows an example of a 1D Fourier transformation of the input function MR signal of the cylinder.

FIG. 5 shows an example of a 1D Fourier transformation of the input function MR signal which contains two transverse magnetization maxima 50, 51 at the location corresponding to the position along the cylinder of the part of the carotid arteries containing the blood with the contrast medium present therein. A value of the arterial input function S(t) associated with an instant t at which the input function MR signal 240 has been measured is then determined, for example from a sum of the transverse magnetizations along the cylinder 30 which have been determined from the 1D Fourier transformation of the input function MR signal.

In order to enable a fast passage of the contrast medium in the carotid arteries to be tracked, if desired the second period with which the input pulse sequence is generated can be reduced so that several input function MR signals 240 can be measured during the first period during which the MR signals are measured for the reconstruction of a single MR image.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method of imaging perfusion of a contrast medium in a first part of a body by means of magnetic resonance (MR) comprising:
    administering a contrast medium to the body,
    measuring MR-signals by generating MR perfusion imaging pulse sequences,
    reconstructing an MR image from the measured MR signals,
    determining a perfusion MR image from a combination of the MR image and an input function of the contrast medium, wherein the input function is determined by application of an input pulse sequence for the excitation of spins in a second elongated part of the body and by measurement of MR signals from the second part, the second elongated part of the body comprising a part of a vessel transporting a supply of the contrast medium to the first part, a cross section of the second elongated part being oriented such that a contribution from excited spins from the contrast medium in the part of the vessel in the second elongated part dominates a contribution from other excited spins of the second elongated part to the MR signal.

2. A method as claimed in claim 1 wherein the input pulse sequence includes a measuring gradient which is oriented along a longitudinal axis of the elongated second part.

3. A method as claimed in claim 2 wherein for the determination of the input function from the measured input function MR signals a value of the input function associated with an instant at which an input function MR signal has been measured is determined from a combination of elements of a one-dimensional Fourier transformation of the input function MR signal.

4. A method as claimed in claim 1 wherein the input sequence includes a 2D excitation RF pulse for excitation of the spins in the second elongated part.

5. A method as claimed in claim 1 wherein the MR imaging pulse sequences include an echo planar imaging (EPI) MR imaging pulse sequence.

6. A method as claimed in claim 5 wherein in the EPI MR imaging pulse sequence an echo time $T_e$ between an excitation RF pulse and a corresponding MR signal is greater than a repetition time $T_r$ between two temporally successive excitation RF pulses.

7. A method as claimed in claim 1 wherein the elongated second part extends transversely to the direction of the supply.

8. A device for magnetic resonance (MR) imaging of a part of a body of a human or animal arranged in the device comprising:
    means for administering a supply of contrast agent to image said part of said body;
    means for generating a steady magnetic field,
    means for generating RF pulses,
    means for generating gradients in the steady magnetic field,
    means for measuring MR signals,
    means for reconstructing an MR image from the measured MR signals,
    means for determining information for determining an input function of a contrast medium in a part of a vessel transporting the contrast medium to a first part of the body,
    a control unit for generating control signals for said means for generating RF pulses and said means for generating the gradients,
    means for determining the input function from the information determined, and
    means for determining an image containing perfusion parameters of the first part from a combination of the MR image and the input function determined,
    wherein the control signals cause application of an input pulse sequence for the excitation of spins in a second elongated part of the body and measurement of MR signals for determination of the information for the determination of the input function from the measured MR signals, the second elongated part of the body comprising the part of the vessel, a cross section of the second elongated part being oriented such that a contribution from excited spins from the contrast medium in the part of the vessel in the second elongated part dominates a contribution from other excited spins of the second elongated part to the MR signal.

9. The method of claim 2 wherein the input pulse sequence includes a 2D excitation RF pulse for excitation of the spins in the second elongated part.

10. The method of claim 2 wherein the MR imaging pulse sequences include an echo planar imaging (EPI) MR imaging pulse sequence.

11. The device of claim 8 wherein the control signals cause application of an input pulse sequence for the excitation of spins in the second elongated part of the body such that the second elongated part extends transversely to the direction of the supply.

* * * * *